(12) United States Patent
Cheng et al.

(10) Patent No.: US 10,139,731 B2
(45) Date of Patent: Nov. 27, 2018

(54) CONVEYOR, DEVELOPING SYSTEM AND METHOD

(71) Applicants: BOE TECHNOLOGY GROUP CO., LTD., Beijing (CN); BEIJING BOE DISPLAY TECHNOLOGY CO., LTD., Beijing (CN)

(72) Inventors: Xiaohui Cheng, Beijing (CN); Hui Yang, Beijing (CN); Peng Chen, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/788,572

(22) Filed: Oct. 19, 2017

(65) Prior Publication Data

US 2018/0188653 A1    Jul. 5, 2018

(30) Foreign Application Priority Data

Jan. 5, 2017    (CN) .......................... 2017 1 0007791

(51) Int. Cl.
| | | |
|---|---|---|
| *G03D 5/00* | (2006.01) | |
| *G03F 7/30* | (2006.01) | |
| *B05B 13/02* | (2006.01) | |
| *B65G 39/10* | (2006.01) | |
| *B65G 13/00* | (2006.01) | |

(52) U.S. Cl.
CPC ............ *G03F 7/30* (2013.01); *B05B 13/0221* (2013.01); *B65G 13/00* (2013.01); *B65G 39/10* (2013.01); *B65G 2201/02* (2013.01)

(58) Field of Classification Search
USPC ........................................................ 396/611
See application file for complete search history.

(56) References Cited

U.S. PATENT DOCUMENTS

| | | | | | |
|---|---|---|---|---|---|
| 3,593,641 | A | * | 7/1971 | Adams .................... | G03D 5/065 118/109 |
| 3,608,464 | A | * | 9/1971 | Harrell .................... | G03D 3/06 101/450.1 |
| 3,610,404 | A | * | 10/1971 | Fleischauer ............ | B65G 13/07 198/787 |
| 3,680,681 | A | * | 8/1972 | Burk ...................... | B65G 39/10 198/349 |
| 3,752,054 | A | * | 8/1973 | Scanlan .................. | G03B 15/00 271/274 |
| 4,145,135 | A | * | 3/1979 | Sara ...................... | G03F 7/3042 222/330 |

(Continued)

*Primary Examiner* — Rodney Fuller
(74) *Attorney, Agent, or Firm* — Nath, Goldberg & Meyer; Joshua B. Goldberg; Daniel Bissing

(57) ABSTRACT

A conveyor, a developing system and a developing method are provided. The conveyor includes a conveying unit configured to convey a substrate and having a plurality of conveying portions. The plurality of conveying portions includes a first tilt conveying portion and a second tilt conveying portion. One of a conveying surface of the first tilt conveying portion and a conveying surface of the second tilt conveying portion is a rising surface configured to raise the substrate gradually, and the other one of the conveying surfaces is a falling surface configured to bring down the substrate gradually.

16 Claims, 3 Drawing Sheets

(56) References Cited

U.S. PATENT DOCUMENTS

| | | | | |
|---|---|---|---|---|
| 6,857,795 B2* | 2/2005 | Lu | ............... | G03F 7/3042 |
| | | | | 396/575 |
| 7,632,028 B2* | 12/2009 | Jeong | ............... | G02F 1/1303 |
| | | | | 396/611 |
| 8,186,787 B2* | 5/2012 | Holbrook | ............... | B41J 25/308 |
| | | | | 347/16 |
| 9,511,607 B2* | 12/2016 | LeFevre | ............... | B41J 11/0085 |
| 2003/0104317 A1* | 6/2003 | Yoshida | ............... | G03F 7/305 |
| | | | | 430/302 |
| 2011/0256656 A1* | 10/2011 | Wang | ............... | H01L 31/18 |
| | | | | 438/62 |
| 2013/0270111 A1* | 10/2013 | Park | ............... | C23C 14/56 |
| | | | | 204/298.23 |

\* cited by examiner

- Prior Art -

CONVEYOR, DEVELOPING SYSTEM AND METHOD

CROSS-REFERENCE TO RELATED APPLICATION

This application claims priority to Chinese Patent Application No. 201710007791.4, filed on Jan. 5, 2017, the contents of which are incorporated by reference in the entirety.

FIELD

The present disclosure relates to the field of display apparatus manufacturing technologies, and particularly, to a conveyor, a developing system and a developing method.

BACKGROUND

In the process of fabricating thin film transistors (TFTs) on a substrate, processes such as photoresist coating, exposure, development and etching are performed. The development process is mainly employed to remove the photoresist retained on the substrate subjected to the exposure process to pre-form a required pattern for a subsequent etching process.

Generally, a spray type developing system is employed in the prior art. In such developing system, a plane where a substrate is located is in parallel with a conveying direction, and the substrate is tilted at a certain angle (typically, a fixed value) with respect to a horizontal plane, in order that developer on the substrate can flow off the substrate as quickly as possible. As such, a lower portion of the substrate receives more developer than an upper portion of the substrate, resulting in an uneven development, which in turn affects uniformity of a line width of pixel (i.e., an actual transmittance width of a sub-pixel unit subjected to the development) and results in abnormal quality issues such as light leakage. Moreover, a motor is required to drive the substrate to be tilted at a certain angle, which takes a long time and thus lowers efficiency of production line.

SUMMARY

To at least partially address the above problems in the prior art, the present disclosure provides a conveyor, a developing system and a developing method, by which the developer can be evenly received by the substrate and the efficiency of the production line can be improved.

In an aspect, the present disclosure provides a conveyor including a conveying unit configured to convey a substrate and having a plurality of conveying portions, the plurality of conveying portions including a first tilt conveying portion and a second tilt conveying portion, wherein one of a conveying surface of the first tilt conveying portion and a conveying surface of the second tilt conveying portion is a rising surface configured to raise the substrate gradually, and the other one of the conveying surfaces is a falling surface configured to bring down the substrate gradually.

Optionally, each of the conveying portions includes a plurality of rollers, and axes of the rollers of the conveying unit are all located in a same plane, said plane being a first plane.

Optionally, the plurality of conveying portions further includes a third conveying portion between the first tilt conveying portion and the second tilt conveying portion, and the third conveying portion is configured to convey the substrate in a plane in parallel with the first plane.

Optionally, the plurality of rollers of the first tilt conveying portion are a plurality of first rollers, and diameters of the plurality of first rollers are gradually decreased one by one in a conveying direction of the substrate.

Optionally, the plurality of rollers of the second tilt conveying portion are a plurality of second rollers, and diameters of the plurality of second rollers are gradually increased one by one in the conveying direction of the substrate.

Optionally, the plurality of rollers of the first tilt conveying portion are a plurality of first rollers, and diameters of the plurality of first rollers are gradually increased one by one in a conveying direction of the substrate.

Optionally, the plurality of rollers of the second tilt conveying portion are a plurality of second rollers, and diameters of the plurality of second rollers are gradually decreased one by one in the conveying direction of the substrate.

Optionally, the plurality of rollers of the third conveying portion is a plurality of third rollers, and diameters of the plurality of third rollers are the same to each other in a conveying direction of the substrate.

Optionally, a length of the first tilt conveying portion is substantially the same as a length of the second tilt conveying portion, in a conveying direction of the substrate.

Optionally, the plurality of conveying portions further includes a fourth buffer conveying portion disposed at a side of the first tilt conveying portion distal to the second tilt conveying portion and configured to convey the substrate on a surface in parallel with the first plane; and a fifth buffer conveying portion disposed at a side of the second tilt conveying portion distal to the first tilt conveying portion and configured to convey the substrate on a surface in parallel with the first plane.

Optionally, an acute angle between the conveying surface of the first tilt conveying portion and the first plane is α, and an acute angle between the conveying surface of the second tilt conveying portion and the first plane is α.

Optionally, the acute angle α ranges from approximately 1 degree to approximately 30 degrees.

Optionally, the acute angle α ranges from approximately 4 degrees to approximately 6 degrees.

In another aspect, the present disclosure further provides a developing system including any one of the above conveyors and a spray unit disposed above the conveying unit and configured to spray developer on a substrate to be developed.

Optionally, the spray unit includes a plurality of nozzles disposed at intervals in a conveying direction of the substrate.

In another aspect, the present disclosure further provides a developing method using the above developing system, including a step of placing a substrate on the conveyor to convey the substrate and turning on the spray unit to spray developer on the substrate simultaneously.

The conveyor of the present disclosure includes two conveying portions provided obliquely, and one of conveying surfaces of the two conveying portions is a rising surface configured to raise the substrate gradually, and the other one of the conveying surfaces is a falling surface configured to bring down the substrate gradually. As such, in the process of conveying the substrate, the conveying surfaces provided obliquely changes an angle of the plane where the substrate is located with respect to the conveying direction multiple times while conveying the substrate, and the processing on the substrate is completed during conveying the substrate. In a case that the conveyor is employed in a developing system, a substrate is tilted at the first tilt conveying portion and the spray unit sprays developer on the substrate to be developed for development; then the substrate is tilted again at the second tilt conveying portion, and the spray unit sprays developer on the substrate to be developed for development. Because one of conveying surfaces of the two conveying portions is the rising surface configured to raise the substrate gradually, and the other one of the conveying surfaces is the falling surface configured to bring down the substrate gradually, the whole surface of the substrate can receives the developer evenly, thereby achieving uniformity of the line width of pixel.

BRIEF DESCRIPTION OF THE FIGURES

The following drawings are merely examples for illustrative purposes according to various disclosed embodiments and are not intended to limit the scope of the present disclosure, in which.

DETAILED DESCRIPTION OF THE EMBODIMENTS

The disclosure will now be described more specifically with reference to the following embodiments. It is to be noted that the following descriptions of some embodiments are presented herein for purpose of illustration and description only. It is not intended to be exhaustive or to be limited to the precise form disclosed.

In the process of fabricating thin film transistors (TFTs) on a substrate, processes such as photoresist coating, exposure, development and etching are performed. The development process is mainly employed to remove the photoresist retained on the substrate after the exposure process, to pre-form a required pattern for a subsequent etching process.

Figure 1:
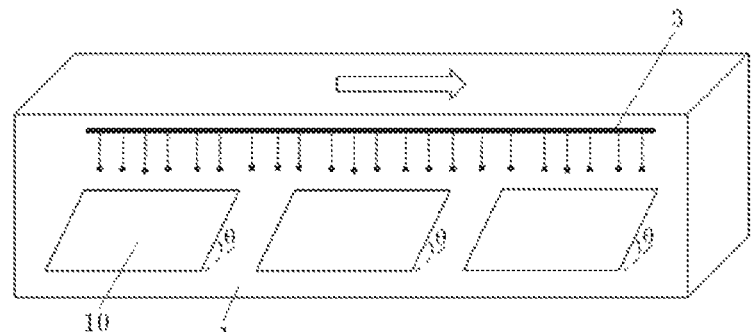
FIG. 1 is a structural schematic diagram of an existing spray type developing system.

Generally, a spray type developing system is employed in the prior art. FIG. 1 is a structural schematic diagram of an existing spray type developing system. As illustrated in FIG. 1, the developing system generally includes a conveying unit 1 and a spray unit 3 disposed above the conveying unit 1. To perform a development process, a substrate 10 subjected to an exposure process may be placed on the conveying unit 1. After that, the conveying unit 1 may drive the substrate 10 to move in a preset direction as indicated by an arrow in FIG. 1), and at the same time, the spray unit 3 sprays developer on a surface of the substrate 10.

A plane where the substrate 10 is located is in parallel with the conveying direction, and the substrate 10 is generally tilted at a certain angle (e.g., an inclined angle θ shown in FIG. 1, which is typically a fixed value) with respect to a horizontal plane, in order that developer on the substrate can flow off the substrate 10 as quickly as possible. As such, a lower portion of the substrate 10 receives more developer than an upper portion of the substrate 10, resulting in an uneven development, which in turn affects uniformity of a line width of pixel and results in abnormal quality issues such as light leakage. Moreover, a motor is required to drive the substrate 10 to be tilted at a certain angle, which takes a long time and thus lowers efficiency of production line.

Figure 2:
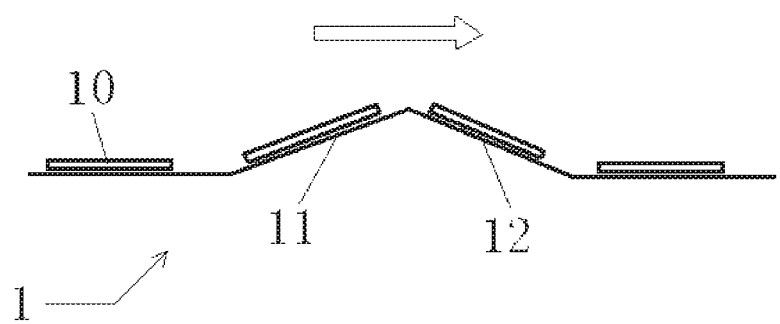
FIG. 2 is a structural schematic diagram of a conveyor according to an embodiment of the present disclosure.
Figure 3:
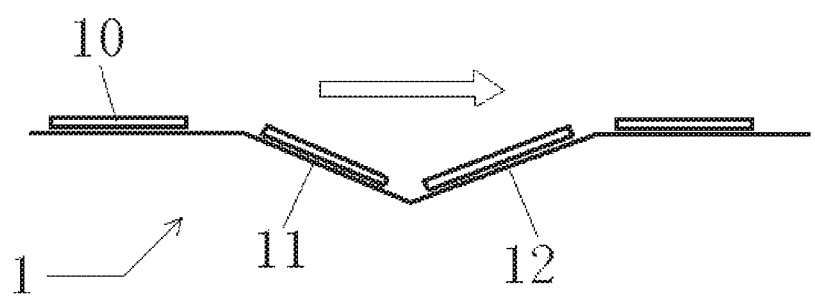
FIG. 3 is a structural schematic diagram of a conveyor according to an embodiment of the present disclosure.

Accordingly, the present disclosure provides, inter alia, a conveyor, a developing system having the same and a developing method that substantially obviate one or more of the problems due to limitations and disadvantages of the related art. In an aspect, embodiments of the present disclosure provide a conveyor. As illustrated in FIGS. 2 and 3, the conveyor includes a conveying unit 1 configured to convey a substrate 10. The conveying unit 1 includes a plurality of conveying portions including a first tilt conveying portion 11 and a second tilt conveying portion 12. One of a conveying surface of the first tilt conveying portion 11 and a conveying surface of the second tilt conveying portion 12 is a rising surface configured to gradually raise the substrate 10, and the other of the conveying surfaces is a falling surface configured to gradually bring down the substrate 10. That is to say, the conveying surface of the first tilt conveying portion 11 is disposed opposite to the conveying surface of the second tilt conveying portion 12, as illustrated in FIG. 2; or, the conveying surface of the first tilt conveying portion 11 is disposed facing the conveying surface of the second tilt conveying portion 12, as illustrated in FIG. 3.

Herein, the term "rising surface" refers to a surface on which a substrate rises up obliquely in a conveying direction of the substrate, and the term "falling surface" refers to a surface on which the substrate falls down obliquely in the conveying direction of the substrate. As used herein, the term "conveying direction" refers to a horizontal direction along which the substrate is conveyed from a loading position to an unloading position, e.g., the direction indicated by the arrow in the figures.

The conveyor in the embodiments includes two conveying portions that are provided obliquely, namely, the first tilt conveying portion 11 and the second tilt conveying portion 12. One of conveying surfaces of the two conveying portions is a rising surface configured to gradually raise the substrate 10, and the other one of the conveying surfaces is a falling surface configured to gradually bring down the substrate 10. As such, in the process of conveying the substrate 10, the conveying surfaces that are provided obliquely changes an angle of the plane where the substrate 10 is located with respect to the conveying direction multiple times while conveying the substrate 10, and the processing on the substrate 10 is completed during conveying the substrate 10. The conveyor in the embodiments is suitable for a production line for manufacturing display substrates, display panels or display apparatuses, and particularly suitable for a process of spraying developer during manufacturing substrates 10 in a production line.

In another aspect, embodiments of the present disclosure provide a developing system comprising any one of the above conveyors provided by the embodiments of the present disclosure. Next, the developing system in the embodiments of the present disclosure and a structure of the conveyor included in the system will be described with reference to FIGS. 4 to 8.

Figure 4:
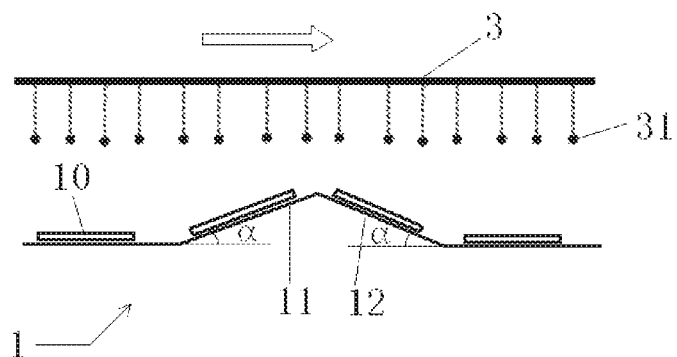
FIG. 4 is a structural schematic diagram of a developing system including a conveyor according to an embodiment of the present disclosure.
Figure 5:
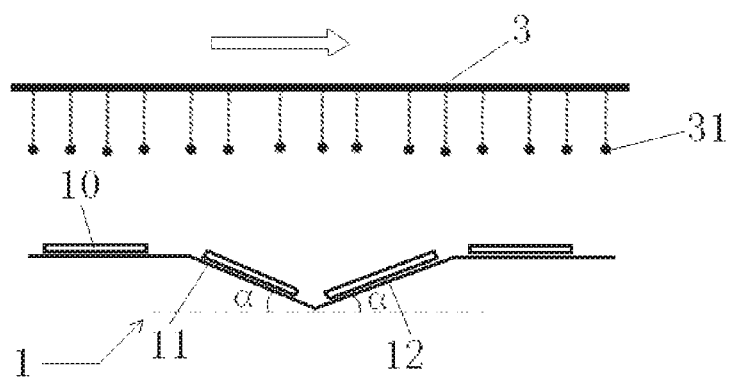
FIG. 5 is a structural schematic diagram of a developing system including a conveyor according to an embodiment of the present disclosure.
Figure 6:
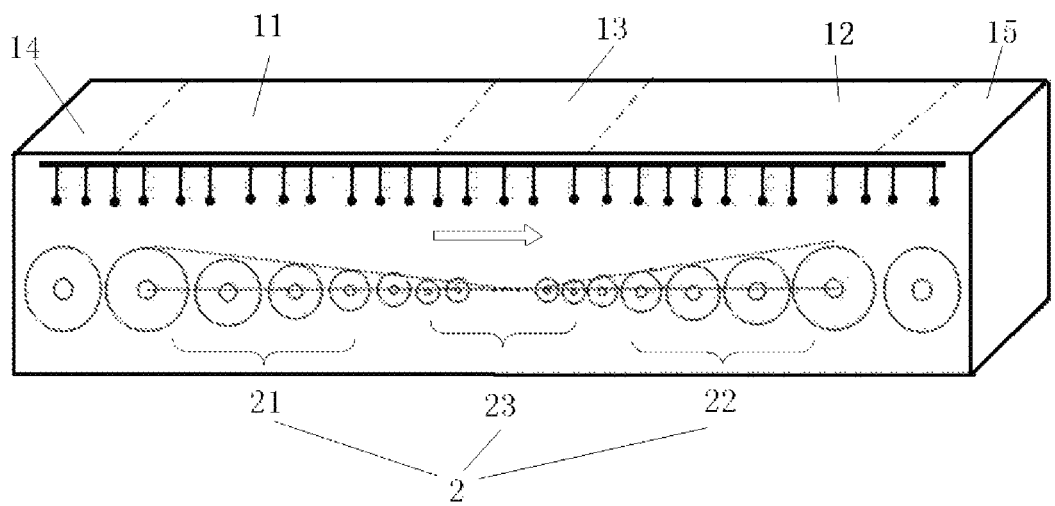
FIG. 6 is a structural schematic diagram of a developing system including a conveyor according to an embodiment of the present disclosure.
Figure 7:
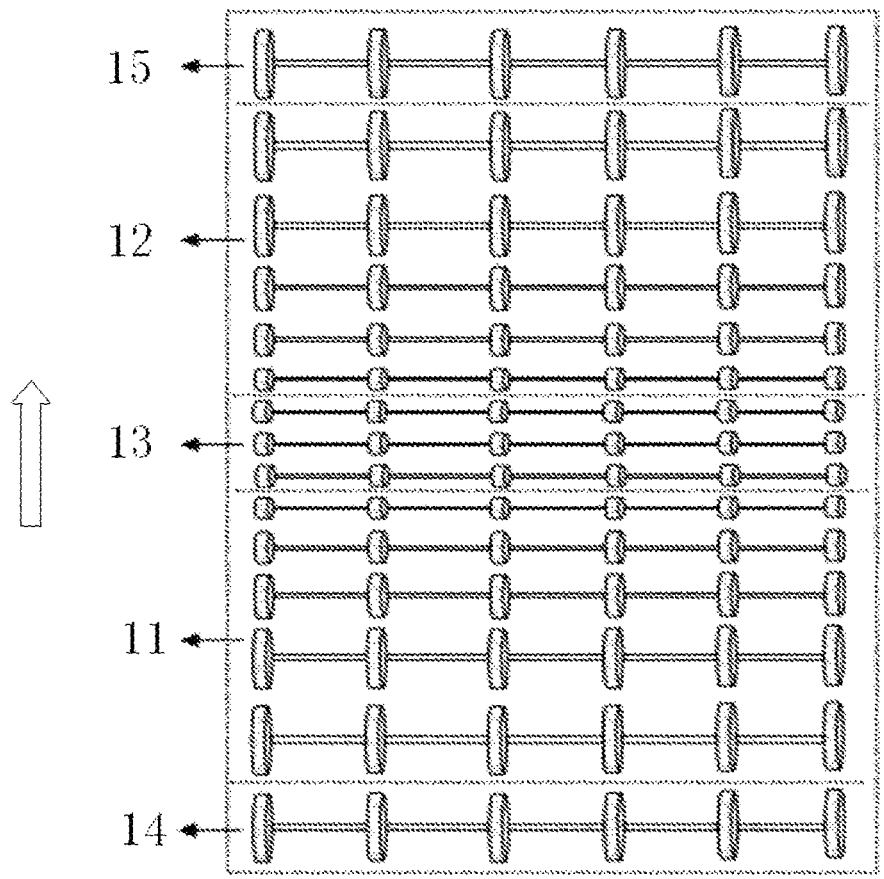
FIG. 7 is a structural schematic diagram of a conveyor according to embodiment of the present disclosure.

As illustrated in FIGS. 4 and 5, the conveyor in the embodiments includes a conveying unit 1 configured to convey a substrate 10. The conveying unit 1 includes a plurality of conveying portions including a first tilt conveying portion 11 and a second tilt conveying portion 12. One of a conveying surface of the first tilt conveying portion 11 and a conveying surface of the second tilt conveying portion 12 is a rising surface configured to gradually raise the substrate 10, and the other one of the conveying surfaces is a falling surface configured to gradually bring down the substrate 10. As illustrated in FIGS. 6 and 7, the conveying portion in the embodiments includes a plurality of rollers 2, and axes of the plurality of rollers 2 are all located in a same plane, i.e., a first plane.

In the embodiments, the plurality of rollers 2 drive the substrate 10 to move in a conveying direction by rotating round their axes, and the plurality of rollers 2 have a same rotating direction, e.g., the plurality of rollers 2 rotate clockwise or counterclockwise simultaneously. According to the embodiments, the substrate 10 can proactively tilt to a certain angle in the conveying direction of the substrate 10 without being driven up or down by a motor. As such, efficient conveying is realized, processing time is reduced, and productivity is improved. Moreover, risk of downtime of apparatus due to jammed motor is reduced, and cost of apparatus can be greatly reduced.

Optionally, the plurality of conveying portions further includes a third conveying portion 13 between the first tilt conveying portion 11 and the second tilt conveying portion 12, and the third conveying portion 13 is configured to convey the substrate 10 in a plane in parallel with the first plane.

In the embodiments, after passing the first tilt conveying portion 11, the substrate 10 is conveyed horizontally before being conveyed obliquely. In this way, the substrate 10 can be fully developed on the third conveying portion 13, and a continuous change of angle of the substrate 10 can slow down, thereby preventing the center of gravity of the substrate 10 from being unstable in the conveying process.

Optionally, the plurality of rollers 2 of the first tilt conveying portion 11 is a plurality of first rollers 21, and diameters of the plurality of first rollers 21 are gradually decreased one by one in the conveying direction of the substrate 10.

Optionally, the plurality of rollers 2 of the second tilt conveying portion 12 are a plurality of second rollers 22, and diameters of the plurality of second rollers 22 are gradually increased one by one in the conveying direction of the substrate 10.

Optionally, the plurality of rollers 2 of the first tilt conveying portion 11 are a plurality of first rollers 21, and diameters of the plurality of first rollers 21 are gradually increased one by one in the conveying direction of the substrate 10.

Optionally, the plurality of rollers 2 of the second tilt conveying portion 12 are a plurality of second rollers 22, and diameters of the plurality of second rollers 22 are gradually decreased one by one in the conveying direction of the substrate 10.

Optionally, the plurality of rollers 2 of the third conveying portion 13 is a plurality of third rollers 23, and diameters of the plurality of third rollers 23 are the same to each other in the conveying direction of the substrate 10.

Figure 8:
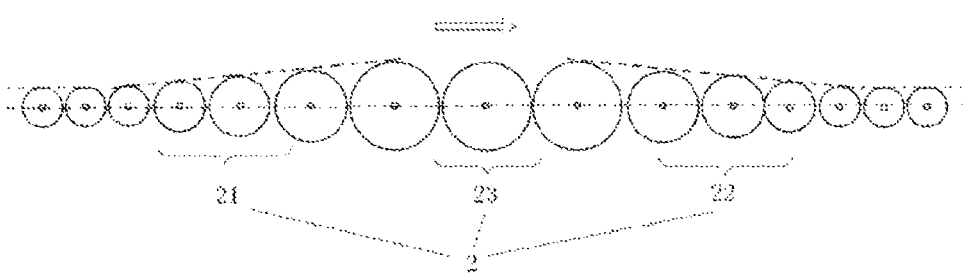
FIG. 8 is a structural schematic diagram of a conveyor according to an embodiment of the present disclosure.

Specifically, as illustrated in FIGS. 6 and 7, the first rollers 21 are each coaxial rollers, and the diameters of the first rollers 21 are gradually decreased one by one in the conveying direction, such that the substrate 10 proactively tilts to a certain angle in the conveying process on the first tilt conveying portion 11, and the substrate 10 is conveyed to the second tilt conveying portion 12 after being fully developed and conveyed by the third conveying portion 12 each being a coaxial third roller 23 and having a same diameter. Because the second rollers 22 are each coaxial rollers and the diameters of the second rollers 22 are gradually increased one by one in the conveying direction, the substrate 10 proactively tilts again to a certain angle. Then, the substrate 10 is horizontally conveyed as it is conveyed before reaching the first tilt conveying portion 11. As illustrated in FIG. 6, the conveying surface of the first tilt conveying portion 11 is a falling surface configured to bring down the substrate gradually, and the conveying surface of the second tilt conveying portion 12 is a rising surface configured to raise the substrate gradually. It can be understood that the conveying surface of the first tilt conveying portion 11 may be a rising surface configured to raise the substrate gradually, and the conveying surface of the second tilt conveying portion 12 may be a falling surface configured to bring down the substrate gradually, as illustrated in FIG. 8.

Optionally, a length of the first tilt conveying portion 11 is substantially the same as a length of the second tilt conveying portion 12, in the conveying direction.

Optionally, an acute angle between the conveying surface of the first tilt conveying portion 11 and the first plane is α, and an acute angle between the conveying surface of the second tilt conveying portion 12 and the first plane is α.

That is to say, the first and second tilt conveying portions 11 and 12 are substantially symmetric to each other. As such, when the developer is sprayed on the substrate 10 to be developed, the case that the lower portion of the substrate 10 receives more developer than its upper portion can be prevented, such that abnormal quality issues such as light leakage caused by non-uniform line width of pixel due to uneven development can be avoided.

Optionally, the acute angle α ranges from approximately 1 degree to approximately 30 degrees. Preferably, the acute angle α ranges from approximately 4 degrees to approximately 6 degrees.

When the tilt angles (i.e., acute angle α) of the first and second tilt conveying portions 11 and 12 are within the above range, it can be ensured that the substrate 10 is stably conveyed, and an even development can be achieved.

Optionally, the plurality of conveying portions further includes a fourth buffer conveying portion 14 disposed at a side of the first tilt conveying portion 11 distal to the second tilt conveying portion 12 and configured to convey the substrate 10 on a surface in parallel with the first plane; and a fifth buffer conveying portion 15 disposed at a side of the second tilt conveying portion 12 distal to the first tilt conveying portion 11 and configured to convey the substrate 10 on a surface in parallel with the first plane.

That is to say, the substrate 10 is horizontally conveyed on the conveyor before reaching the first tilt conveying portion 11, and the substrate 10 is horizontally conveyed again after being developed (i.e., after passing the second tilt conveying portion 12). With this design, the substrate 10 are buffered horizontally before and after being tilted, so as to ensure that the center of gravity of the substrate 10 is stable in the process of being conveyed to a subsequent process and that the substrate 10 is unlikely to be damaged. As illustrated in FIG. 8, a conveying surface of the fourth buffer conveying portion 14 and a conveying surface of the fifth buffer conveying portion 15 may be in a same plane, which is in parallel with the first plane (i.e., the plane where the axes of the rollers are located).

As illustrated in FIGS. 4 to 6, in addition to the conveyor, the developing system in the embodiments further includes a spray unit 3 disposed above the conveying unit 1. The spray unit 3 includes a plurality of nozzles disposed at intervals in the conveying direction and is configured to spray developer on the substrate to be developed.

When the developing system in the embodiments is used, the substrate 10 is tilted on the first tilt conveying portion 11 and the spray unit 3 sprays developer on the substrate 10 to be developed for development. After that, the substrate 10 is tilted again on the second tilt conveying portion 12, and again the spray unit 3 sprays developer on the substrate 10 to be developed for development. Because one of the conveying surfaces of the two conveying portions is a rising surface configured to raise the substrate gradually and the other of the conveying surfaces is a falling surface configured to bring down the substrate gradually, the whole surface of the substrate 10 evenly receives developer, and in turn line width of pixel is uniform.

In another aspect, embodiments of the present disclosure provides a developing method using the above developing system, including a step of placing a substrate on the conveyor to convey the substrate and turning on the spray unit to spray developer on the substrate simultaneously.

In the developing method of the embodiments, the substrate is tilted on the first tilt conveying portion for the first time and the spray unit sprays developer on the substrate to be developed for development. After that, the substrate is tilted again on the second tilt conveying portion, and again the spray unit sprays developer on the substrate to be developed for development. Because one of the conveying surfaces of the two conveying portions is a rising surface configured to raise the substrate gradually and the other one of the conveying surfaces is a falling surface configured to bring down the substrate gradually, the whole surface of the substrate evenly receives developer, and in turn line width of pixel is uniform.

Needless to say, a variety of variations may be made to the foregoing implementations in the above embodiments. For example, the specific dimension of the diameter of the roller can be adjusted depending on the size of the substrate, and the rotating speed of the roller can be changed as required.

It should be understood that the above implementations are merely exemplary implementations adopted for explaining the principle of the present disclosure, but the present disclosure is not limited thereto. For those skilled in the art, various modifications and improvements may be made without departing from the spirit and essence of the present disclosure, and these modifications and improvements are also considered to be within the protection scope of the present disclosure.

What is claimed is:

1. A conveyor, comprising a conveying unit configured to convey a substrate and having a plurality of conveying portions, the plurality of conveying portions comprising a first tilt conveying portion and a second tilt conveying portion, wherein
    one of a conveying surface of the first tilt conveying portion and a conveying surface of the second tilt conveying portion is a rising surface configured to raise the substrate gradually, and the other one of the conveying surfaces is a falling surface configured to bring down the substrate gradually,
    wherein each of the conveying portions comprises a plurality of roller groups, each roller group comprises a plurality of rollers spaced apart from each other along a length direction of the roller group, and axes of the roller groups of the conveying unit are all located in a same plane, said plane being a first plane, and
    wherein the rollers in each roller group have a same diameter.

2. The conveyor according to claim 1, wherein the plurality of conveying portions further comprises a third conveying portion between the first tilt conveying portion and the second tilt conveying portion, and the third conveying portion is configured to convey the substrate in a plane in parallel with the first plane.

3. The conveyor according to claim 2, wherein the plurality of roller groups of the third conveying portion is a plurality of third roller groups, and diameters of the plurality of third roller groups are the same to each other in a conveying direction of the substrate.

4. The conveyor according to claim 1, wherein the plurality of roller groups of the first tilt conveying portion is a plurality of first roller groups, and diameters of the plurality of first roller groups are gradually decreased one by one in a conveying direction of the substrate.

5. The conveyor according to claim 4, wherein the plurality of roller groups of the second tilt conveying portion are a plurality of second roller groups, and diameters of the plurality of second roller groups are gradually increased one by one in the conveying direction of the substrate.

6. The conveyor according to claim 1, wherein the plurality of roller groups of the first tilt conveying portion are a plurality of first roller groups, and diameters of the plurality of first roller groups are gradually increased one by one in a conveying direction of the substrate.

7. The conveyor according to claim 6, wherein the plurality of roller groups of the second tilt conveying portion are a plurality of second roller groups, and diameters of the plurality of second roller groups are gradually decreased one by one in the conveying direction of the substrate.

8. The conveyor according to claim 1, wherein a length of the first tilt conveying portion is substantially the same as a length of the second tilt conveying portion, in a conveying direction of the substrate.

9. The conveyor according to claim 1, wherein the plurality of conveying portions further comprises a fourth buffer conveying portion disposed at a side of the first tilt conveying portion distal to the second tilt conveying portion and configured to convey the substrate on a surface in parallel with the first plane; and a fifth buffer conveying portion disposed at a side of the second tilt conveying portion distal to the first tilt conveying portion and configured to convey the substrate on a surface in parallel with the first plane.

10. The conveyor according to claim 1, wherein an acute angle between the conveying surface of the first tilt conveying portion and the first plane is $\alpha$, and an acute angle between the conveying surface of the second tilt conveying portion and the first plane is $\alpha$.

11. The conveyor according to claim 10, wherein the acute angle $\alpha$ ranges from approximately 1 degree to approximately 30 degrees.

12. The conveyor according to claim 11, wherein the acute angle $\alpha$ ranges from approximately 4 degrees to approximately 6 degrees.

13. A developing system, comprising the conveyor of claim 1 and a spray unit disposed above the conveying unit, the spray unit being configured to spray developer on a substrate to be developed,
wherein the spray unit comprises a plurality of nozzles disposed at intervals in a conveying direction of the substrate, and
wherein the plurality of nozzles are arranged right above the plurality of conveying portions, respectively.

14. The developing system according to claim 13, wherein the plurality of conveying portions further comprises a third conveying portion between the first tilt conveying portion and the second tilt conveying portion, and the third conveying portion is configured to convey the substrate in a plane in parallel with the first plane.

15. The developing system according to claim 13, wherein the plurality of roller groups of the first tilt conveying portion are a plurality of first roller groups, the plurality of roller groups of the second tilt conveying portion are a plurality of second roller groups, and wherein in a conveying direction of the substrate, diameters of the plurality of first roller group are gradually decreased one by one and diameters of the plurality of second roller groups are gradually increased one by one; or in the conveying direction of the substrate, diameters of the plurality of first roller groups are gradually increased one by one and diameters of the plurality of second roller groups are gradually decreased one by one.

16. A developing method using the developing system of claim 13, comprising a step of:
placing a substrate on the conveyor to convey the substrate; and
turning on respective nozzles arranged right above respective conveying portions to spray developer on the substrate when the substrate is conveyed through the respective conveying portions.

* * * * *